US012525929B2

(12) United States Patent
Nasu (10) Patent No.: US 12,525,929 B2
(45) Date of Patent: Jan. 13, 2026

(54) AMPLIFIER CIRCUIT

(71) Applicant: Murata Manufacturing Co., Ltd., Kyoto (JP)

(72) Inventor: Koji Nasu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 576 days.

(21) Appl. No.: 18/050,082

(22) Filed: Oct. 27, 2022

(65) Prior Publication Data

US 2023/0070816 A1 Mar. 9, 2023

Related U.S. Application Data

(63) Continuation of application No. PCT/JP2021/015232, filed on Apr. 12, 2021.

(30) Foreign Application Priority Data

May 21, 2020 (JP) .................................. 2020-089160

(51) Int. Cl.
   *H03F 3/193* (2006.01)
   *H03F 1/02* (2006.01)
   *H03F 1/34* (2006.01)

(52) U.S. Cl.
   CPC ........... *H03F 3/193* (2013.01); *H03F 1/0211* (2013.01); *H03F 1/342* (2013.01)

(58) Field of Classification Search
   CPC ........ H03F 3/193; H03F 1/0211; H03F 1/342; H03F 1/302; H03F 2200/451
   USPC ........................................................ 330/277
   See application file for complete search history.

(56) References Cited

U.S. PATENT DOCUMENTS

| | | | |
|---|---|---|---|
| 2002/0121936 A1 | 9/2002 | Gharpurey et al. |
| 2005/0179484 A1 | 8/2005 | Sasho et al. |
| 2007/0139120 A1 | 6/2007 | Luo et al. |
| 2015/0061770 A1 | 3/2015 | Luo et al. |
| 2016/0190992 A1 | 6/2016 | Ridgers et al. |
| 2018/0152155 A1 | 5/2018 | Vogt |

FOREIGN PATENT DOCUMENTS

| | | |
|---|---|---|
| JP | 2002-232238 A | 8/2002 |
| JP | 2005-228196 A | 8/2005 |
| JP | 2015-046876 A | 3/2015 |

OTHER PUBLICATIONS

International Search Report for PCT/JP2021/015232 dated Jun. 29, 2021.

*Primary Examiner* — Andrea Lindgren Baltzell
*Assistant Examiner* — Khiem D Nguyen
(74) *Attorney, Agent, or Firm* — McDonald Hopkins LLC (57) ABSTRACT

An amplifier circuit includes an amplifier and a bias circuit. The bias circuit includes a bias transistor having a base terminal and a collector terminal, a transistor having a gate terminal, a source terminal, and a drain terminal, a transistor having a gate terminal, a source terminal, and a drain terminal, resistors, and a current source. The source terminals are connected to a power source. One end portion of the resistor is connected to the base terminal, the other end portion of the resistor is connected to the drain terminal, one end portion of the resistor is connected to the other end portion of the resistor, the other end portion of the resistor is connected to the bias output terminal, and the bias circuit further includes a feedback circuit that controls the electric potential of the base terminal based on the electric potential of the collector terminal.

8 Claims, 5 Drawing Sheets

AMPLIFIER CIRCUIT

CROSS REFERENCE TO RELATED APPLICATION

This is a continuation of International Application No. PCT/JP2021/015232 filed on Apr. 12, 2021 which claims priority from Japanese Patent Application No. 2020-089160 filed on May 21, 2020. The contents of these applications are incorporated herein by reference in their entireties.

BACKGROUND ART

Technical Field

The present disclosure relates to an amplifier circuit including a bias circuit.

Patent Document 1 discloses an RF power amplifier circuit that includes an RF power amplifier including an amplifier transistor and a bias circuit connected to the RF amplifier. The bias circuit includes a bias transistor that forms a current mirror together with the amplifier transistor, a current source connected to a drain terminal of the bias transistor, and a first transistor and a second transistor that are connected between the current source and the bias transistor and form a current mirror. Drain terminals of the first transistor and the second transistor are connected to a power source. Further, a first resistor is connected between a gate terminal and a drain terminal of the bias transistor, and a second resistor is connected between the amplifier transistor and the bias transistor, Patent Document 1: Japanese Unexamined Patent Application Publication No. 2015-46876

BRIEF SUMMARY

However, in the RF power amplifier circuit disclosed in Patent Document 1, when a low-voltage power source is used and the electric potential of the gate and the electric potential of the drain of the bias transistor are secured at high electric potentials, there is a possibility that the drain-source voltage of the second transistor becomes low and the second transistor malfunctions. As a result, this leads to a problem that a stable bias signal cannot be supplied to the amplifying transistor, which forms the current mirror together with the bias transistor.

The present disclosure provides an amplifier circuit including a bias circuit that enables a supply of a stable bias signal.

An amplifier circuit according to one aspect of the present disclosure includes: an amplifier including an amplifying transistor; and a bias circuit that supplies a bias signal to the amplifier, wherein the bias circuit includes a bias output terminal connected to the amplifier, a bias transistor having a first control terminal, a first terminal, and a second terminal, a first transistor having a second control terminal, a third terminal, and a fourth terminal, a second transistor having a third control terminal, a fifth terminal, and a sixth terminal, a first resistor and a second resistor, and a current source connected to the third terminal or the fourth terminal, the amplifying transistor and the bias transistor form a first current mirror circuit, the first transistor and the second transistor form a second current mirror circuit, the third terminal and the fifth terminal are connected to a power source, one end portion of the first resistor is connected to the first control terminal, another end portion of the first resistor is connected to the sixth terminal, one end portion of the second resistor is connected to the other end portion of the first resistor, another end portion of the second resistor is connected to the bias output terminal, and the bias circuit further includes a feedback circuit that controls an electric potential of the first control terminal based on an electric potential of the first terminal.

According to the present disclosure, it is possible to provide an amplifier circuit including a bias circuit that enables the supply of a stable bias signal.

DETAILED DESCRIPTION

Hereinafter, embodiments of the present disclosure will be described in detail using embodiments and drawings thereof. Note that the embodiments, which will be described below, each illustrates a general or specific example. Numeric values, shapes, materials, constituent elements, arrangements and connection modes of the constituent elements, and the like illustrated in the following embodiments are mere examples, and not intended to limit the present disclosure. Of the constituent elements in the following embodiments, the constituent elements that are not described in an independent claim will be described as optional constituent elements. Further, sizes or ratios of the sizes of the constituent elements illustrated in the drawings are not necessarily exact ones.

Embodiment 1

Figure 1:
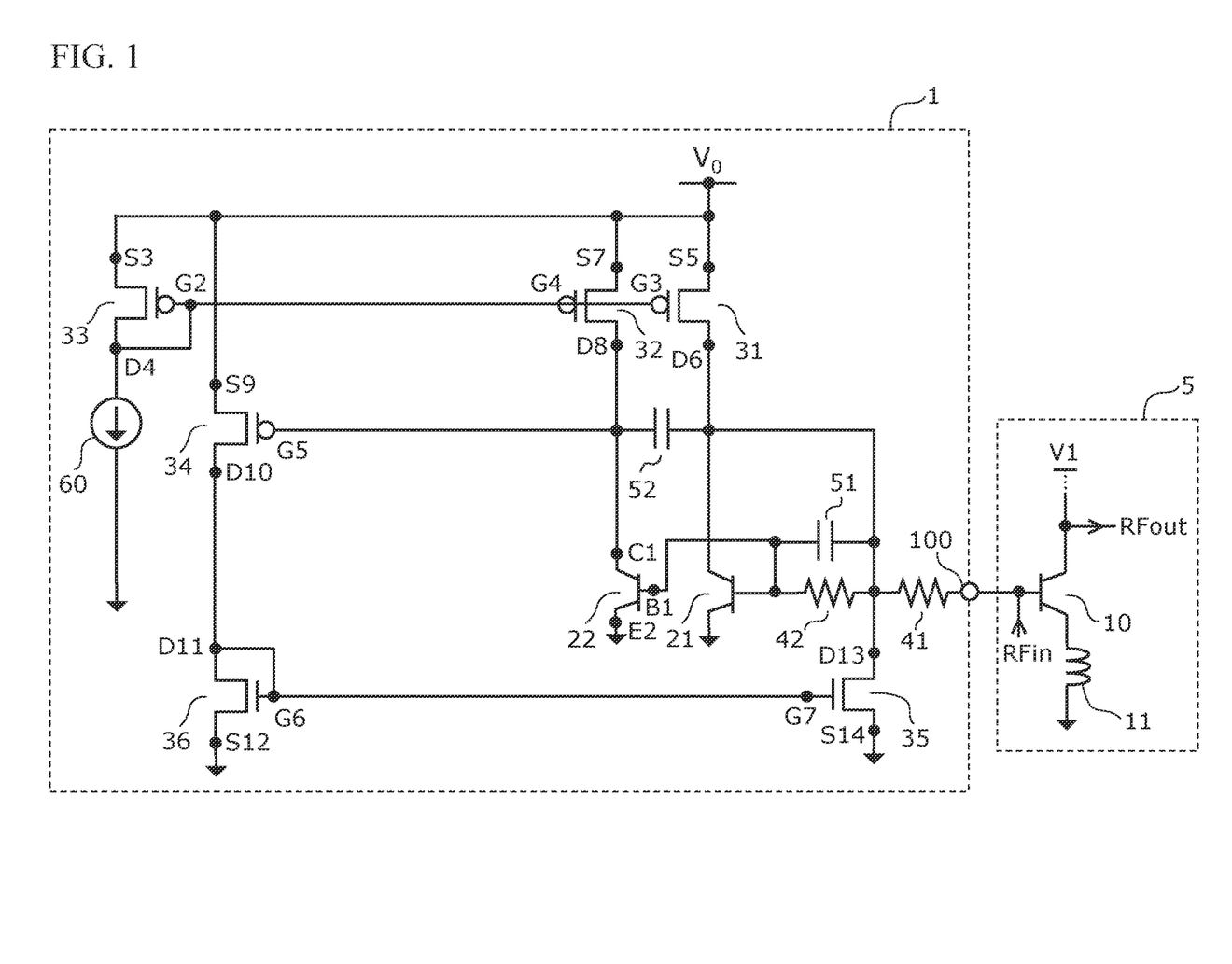
FIG. 1 is a circuit configuration diagram of an amplifier circuit according to Embodiment 1.

FIG. 1 is a circuit configuration diagram of an amplifier circuit according to Embodiment 1. As illustrated in FIG. 1, the amplifier circuit according to the present embodiment includes an amplifier 5 and a bias circuit 1.

The amplifier 5 includes an amplifying transistor 10 and an inductor 11. The amplifying transistor 10 is, for example, a bipolar-type transistor. A base terminal of the amplifying transistor 10 is connected to a bias output terminal 100 of the bias circuit 1. Further, a radio-frequency signal RFin is input to the base terminal of the amplifying transistor 10. The inductor 11 is connected between an emitter terminal of the amplifying transistor 10 and a ground. Further, a collector terminal of the amplifying transistor 10 is connected to a power source (power source voltage V1). Further, a radio-frequency signal RFout is input from the collector terminal of the amplifying transistor 10. With the foregoing configuration, the amplifier 5 amplifies the power of the radio-frequency signal RFin input from the base terminal and outputs it as the radio-frequency signal RFout from the collector terminal.

Note that a circuit element, such as an inductor, a capacitor, a switch, or the like may be arranged between the collector terminal of the amplifying transistor 10 and the power source. Further, a circuit element such as a DC-cut capacitor or the like may be connected to the base terminal of the amplifying transistor 10. Further, instead of the inductor 11, a different circuit element may be connected to the emitter terminal of the amplifying transistor 10.

The bias circuit 1 includes the bias output terminal 100, a bias transistor 22, transistors 21, 31, 32, 33, 34, 35, and 36, resistors 41 and 42, capacitors 51 and 52, and a current source 60.

The bias output terminal 100 is connected to the base terminal of the amplifying transistor 10 of the amplifier 5.

The bias transistor 22 is an n-type bipolar transistor having a base terminal B1 (first control terminal), a collector terminal C1 (first terminal), and an emitter terminal E2 (second terminal).

The transistor 33 is an example of a first transistor and is a p-type field-effect-type transistor having a gate terminal G2 (second control terminal), a source terminal S3 (third terminal), and a drain terminal D4 (fourth terminal). The transistor 31 is an example of a second transistor and is a p-type field-effect-type transistor having a gate terminal G3 (third control terminal), a source terminal S5 (fifth terminal), and a drain terminal D6 (sixth terminal).

The transistor 32 is an example of a third transistor and is a p-type field-effect-type transistor having a gate terminal G4 (fourth control terminal), a source terminal S7 (seventh terminal), and a drain terminal D8 (eighth terminal). The transistor 34 is an example of a fourth transistor and is a p-type field-effect-type transistor having a gate terminal G5 (fifth control terminal), a source terminal S9 (ninth terminal), and a drain terminal D10 (tenth terminal).

The transistor 36 is an example of a fifth transistor and is an n-type field-effect-type transistor having a gate terminal G6 (sixth control terminal), a drain terminal D11 (eleventh terminal), and a source terminal S12 (twelfth terminal). The transistor 35 is an example of a sixth transistor and is an n-type field-effect-type transistor having a gate terminal G7 (seventh control terminal), a drain terminal D13 (thirteenth terminal), and a source terminal S14 (fourteenth terminal).

The current source 60 is connected between the drain terminal D4 and the ground. Note that the current source 60 may alternatively be connected between the source terminal S3 and a power source (power source voltage V0).

The resistor 42 is an example of a first resistor, one end portion of the resistor 42 is connected to the base terminal B1, and the other end portion of the resistor 42 is connected to the drain terminal D6. The resistor 41 is an example of a second resistor, one end portion of the resistor 41 is connected to the other end portion of the resistor 42, and the other end portion of the resistor 41 is connected to the bias output terminal 100. The emitter terminal E2 is connected to the ground. With the foregoing configuration, the amplifying transistor 10 and the bias transistor 22 form a first current mirror circuit.

The source terminals S3, S5, S7, and S9 are connected to the power source (power source voltage V0). Further, the gate terminal G2 is connected to the gate terminals G3 and G4. The gate terminal G2 and the drain terminal D4 are connected to each other. With the foregoing configuration, the transistor 31 and the transistor 33 form a second current mirror circuit.

The drain terminal D8 is connected to the collector terminal C1 and the gate terminal G5.

The drain terminal D11 is connected to the drain terminal D10, and the drain terminal D13 is connected to a connecting node between the resistor 41 and the resistor 42. The gate terminal G6 is connected to the gate terminal G7. The source terminals S12 and S14 are connected to the ground. With the foregoing configuration, the transistor 35 and the transistor 36 form a third current mirror circuit.

The transistor 21 is an example of a seventh transistor and is an n-type bipolar transistor having a base terminal (eighth control terminal), a collector terminal (fifteenth terminal), and an emitter terminal (sixteenth terminal). The base terminal of the transistor 21 is connected to the base terminal B1, the collector terminal of the transistor 21 is connected to the drain terminal D6, and the emitter terminal of the transistor 21 is connected to the ground.

The capacitor 52 is an example of a first capacitor and is connected between the drain terminal D6 and the drain terminal D8. The capacitor 51 is an example of a second capacitor and is connected between the base terminal B1 and a connecting node between the resistors 41 and 42.

In the bias circuit 1 according to the present embodiment, the bias transistor 22, the resistors 41 and 42, and the transistors 31 and 33 are basic circuit elements for supplying a bias signal (bias current) to the amplifier 5.

In contrast, the transistors 32, 34, 35, 36, and 21 and the capacitors 51 and 52 form a feedback circuit for providing a stable supply of the bias signal (bias current) to the amplifying transistor 10. Specifically, the foregoing feedback circuit controls the electric potential of the collector terminal C1 based on the electric potential of the base terminal B1 of the bias transistor 22. This stabilizes the electric potential of the drain terminal D6 of the transistor 31. Because the drain terminal D6 is connected to the base terminal of the amplifying transistor 10 via the resistor 41, by stabilizing the electric potential of the drain terminal D6, it is possible to provide a stable supply of the bias signal (bias current) to the base terminal of the amplifying transistor 10.

In the following section, the working of the foregoing feedback circuit is described in detail while referring to a comparative example.

Figure 2:
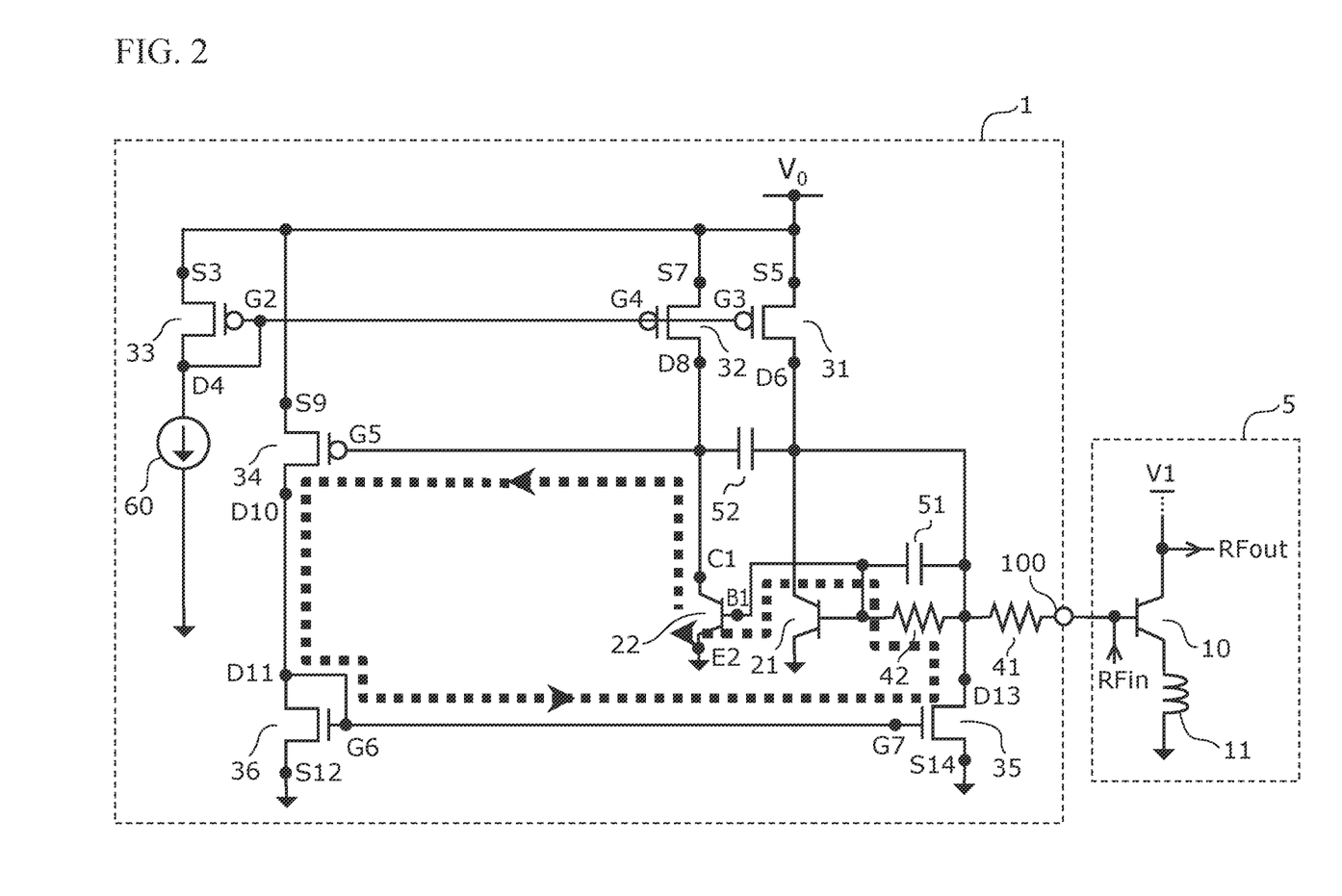
FIG. 2 is a diagram illustrating a feedback loop in a bias circuit according to Embodiment 1.
Figure 3:
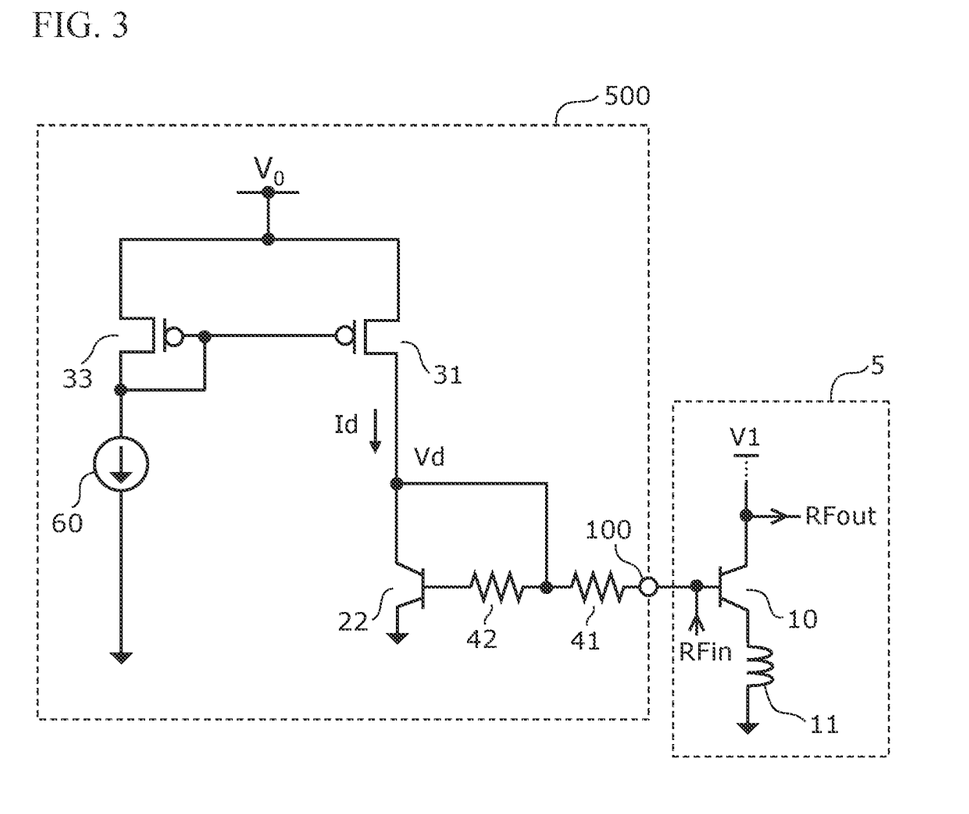
FIG. 3 is a circuit configuration diagram of a bias circuit according to a comparative example.

FIG. 2 is a diagram illustrating a feedback loop in the bias circuit 1 according to Embodiment 1. Further, FIG. 3 is a circuit configuration diagram of a bias circuit 500 according to a comparative example. The bias circuit 500 according to the comparative example is different from the bias circuit 1 according to Embodiment 1 in not including the foregoing feedback circuit.

As illustrated in FIG. 3, in the bias circuit 500 according to the comparative example, the transistors 33 and 31 form a current mirror circuit, and thus originally a drain current having the same magnitude as the drain current of the transistor 33, to which the current source 60 is connected, flows through the transistor 31. However, the electric potential Vd of the drain terminal of the transistor 31 is the electric potential of the connecting node between the resistors 41 and 42, and thus the electric potential Vd rises as the bias current supplied to the base terminal of the amplifying transistor 10 increases.

Further, for example, in the case where the amplifier is a low-noise amplifier, the values of the resistors 41 and 42 need to be increased in order to suppress degradation of noise figure caused by the bias circuit 500 (in order to ensure the separation between the bias circuit 500 and the amplifier). However, in particular, in the case where a bipolar transistor is used as the amplifying transistor 10, a voltage drop caused by the base current increases when the resistance value of the resistor 42 is increased. That is to say, because the electric potential Vd of the drain terminal of the transistor 31 is determined by the product of the foregoing bias current and the resistor 41, the electric potential Vd of the drain terminal of the transistor 31 rises.

Further, in the case where the power source voltage V0 is low, as the electric potential Vd of the drain terminal of the transistor 31 rises, the source-drain voltage of the transistor 31 decreases. This destabilizes the drain current of the transistor 31 and makes it difficult to supply a stable bias current to the amplifying transistor 10.

In contrast, in the bias circuit 1 according to the present embodiment, as illustrated in FIG. 2, the feedback circuit is added to the bias circuit 500 according to the comparative example.

The foregoing feedback circuit is made up of the transistors 32, 34, 35, 36, and 21 and the capacitors 51 and 52.

First, the transistors 33 and 31 form the second current mirror circuit, and further the transistor 33 and 32 also form a current mirror circuit. Thus, originally, the drain current having the same magnitude as the drain current of the transistor 33, to which the current source 60 is connected, flows through the transistors 31 and 32.

However, the electric potential of the drain terminal D6 is the electric potential of the connecting node between the resistors 41 and 42 and rises because of the amount of the voltage drop determined by the product of the resistor 41 and the base current. Thus, there is a concern that the source-drain voltage of the transistor 31 cannot be secured.

Here, the source-drain voltage of the transistor 32 becomes the gate-source voltage of the transistor 34 and can be a stable voltage. On the other hand, the drain terminal D8 of the transistor 32 is connected to the collector terminal C1 of the bias transistor 22, but the collector terminal C1 is not connected to the base terminal B1. Thus, the collector terminal C1 is in a high-impedance state and is subject to severe voltage variation. In contrast, the foregoing feedback circuit suppresses the foregoing voltage variation by making the collector current flowing through the bias transistor 22 and the collector current flowing through the transistor 32 more equal to each other by controlling the electric potential of the collector terminal C1.

Specifically, the collector terminal C1 is connected to the gate terminal G5 of the transistor 34. The drain current corresponding to the gate-source voltage of the transistor 34 flows through the transistors 36 and 35 that form the third current mirror circuit. The drain terminal D13 is connected to the connecting node between the resistors 41 and 42, and thus the drain current flowing through the transistor 35 is supplied to the base terminal of the amplifying transistor 10 and the base terminal B1 of the bias transistor 22.

That is to say, the feedback circuit forms a feedback loop of the collector terminal C1, the drain terminal D8, the transistors 34, 36, and 35, the connecting node between the resistors 41 and 42, the base terminal B1, and the collector terminal C1. In the following section, the working of the foregoing feedback circuit is illustrated by an example.

For example, when the electric potential of the base terminal B1 falls, a drawn current to the bias transistor 22 decreases, and the electric potential of the collector terminal C1 rises. When the electric potential of the collector terminal C1 rises, the gate-source voltage of the transistor 34 decreases. When the gate-source voltage of the transistor 34 decreases, the drain currents of the transistors 35 and 36 decrease. When the drain currents of the transistors 35 and 36 decrease, the electric potential of the connecting node between the resistors 41 and 42 rises, and the electric potential of the base terminal B1 rises. When the electric potential of the base terminal B1 rises, the drawn current to the bias transistor 22 becomes larger, and the electric potential of the collector terminal C1 falls. That is to say, when the electric potential of the collector terminal C1 becomes higher, the electric potential of the collector terminal C1 is made lower by causing the electric potential of the base terminal B1 to rise. On the other hand, when the electric potential of the collector terminal C1 becomes lower, the electric potential of collector terminal C1 is made higher by causing the electric potential of the base terminal B1 to fall.

In other words, by controlling the electric potential of the collector terminal C1, the foregoing feedback circuit enables the collector current flowing through the bias transistor 22 and the collector current flowing through the transistor 32 to be more equal to each other and an electric potential to be generated at the base terminal B1 and used as the bias electric potential of the transistor 10.

Further, because the base terminal B1 of the bias transistor 22 and the base terminal of the transistor 21 are connected to the same node (one end portion of the resistor 42), the drain terminal D6 of the transistor 31 that is connected to the collector terminal of the transistor 21 also operates in a similar way to the collector terminal C1, and this enables the electric potential of the drain terminal D6 to be stabilized.

That is to say, the bias circuit 1 according to the present embodiment has the configuration in which the transistor 32 and the bias transistor 22 are equivalently added to the bias circuit 500 according to the comparative example. The source-drain voltage of the transistor 32 is always equal to the gate-source voltage of the transistor 34, and thus, the current ratio of the transistor 33 and the transistor 32 is appropriately maintained even when the power source voltage, the temperature, the fabrication process, or the like varies. The electric potential of the base terminal B1 of the bias transistor 22 is controlled by the foregoing feedback circuit in such a way that the same current as the drain current of the transistor 32 flows through the bias transistor 22. As a result, the variation in the bias current to the amplifying transistor 10 is suppressed.

Further, in the bias circuit 1 according to the present embodiment, the capacitor 52 is arranged between the drain terminal D6 and the drain terminal D8. The capacitor 52 enables an oscillation of the feedback circuit to be suppressed.

Further, in the bias circuit 1 according to the present embodiment, the capacitor 51 is arranged between the base terminal B1 and the connecting node between the resistors 41 and 42. There is a concern that at start-up of the bias circuit 1, a bias current having an excessive magnitude for the amplifying transistor 10 (inrush current) flows before the feedback circuit starts to function. In contrast, the capacitor 51 enables a signal of the feedback circuit to be promptly transmitted via the capacitor 51 to the base terminal B1 of the bias transistor 22. Accordingly, it is possible to suppress the flow of the inrush current into the amplifying transistor 10.

Further, the transistor 21 is placed in the bias circuit 1 according to the present embodiment. In the case where the transistor 21 is not placed, the drain terminal D6 is in a high-impedance state, and for example, at start-up of the bias circuit 1, variation in electric potential becomes larger. In contrast, because of the placement of the transistor 21, it is possible to cause the drain terminal D6 to be in a low-impedance state, suppress the foregoing variation in electric potential at start-up, and suppress the supply of overcurrent to the amplifying transistor 10.

Note that in the bias circuit 1 according to the present embodiment, the transistor 21 and the capacitors 51 and 52 may be omitted. In this case, because the capacitor 51 is not placed, the base terminal B1 and the drain terminal D6 are not connected (open). Further, because the capacitor 52 is not placed, the drain terminal D6 and the drain terminal D8 are not connected (open). Further, because the transistor 21 is not placed, the drain terminal D6 and the ground are not connected (open).

Note that in the case where the bipolar-type transistor is defined as a transistor of a first kind and the field-effect-type transistor is defined as a transistor of a second kind, the amplifying transistor 10 and the bias transistor 22 may be transistors of the same conductivity type and of the same kind. In this case, the transistors 31, 32, and 33 may be transistors of a conductivity type that is different from the conductivity type of the amplifying transistor 10 and the bias transistor 22 and of the same kind common to the transistors 31 to 33. Further, in this case, the transistor 34 may be a transistor of the same conductivity type as the transistors 31, 32, and 33. Further, in this case, the transistors 35 and 36 may be transistors of the same conductivity type as the conductivity type of the amplifying transistor 10 and the bias transistor 22 and of the same kind common to the transistors 35 and 36. Note that as the conductivity type, there are, for example, an n-channel type and a p-channel type. For example, in the case where the first conductivity type is the n-channel type, the second (other) conductivity type is the p-channel type.

Embodiment 2

In the present embodiment, a bias circuit 2 including a feedback circuit that uses an operational amplifier is described.

Figure 4:
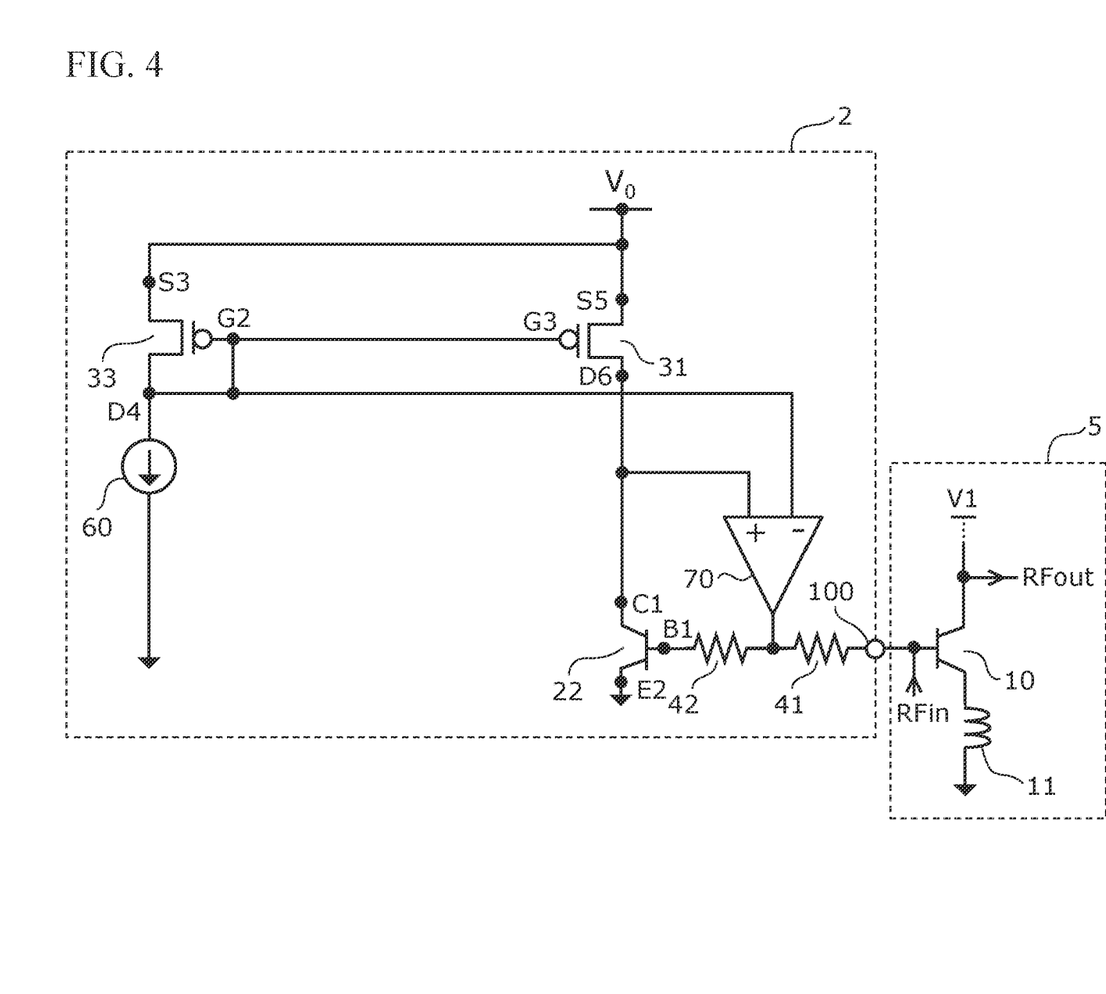
FIG. 4 is a circuit configuration diagram of an amplifier circuit according to Embodiment 2.

FIG. 4 is a circuit configuration diagram of an amplifier circuit according to Embodiment 2. As illustrated in FIG. 4, the amplifier circuit according to the present embodiment includes the amplifier 5 and a bias circuit 2. The amplifier circuit according to the present embodiment is different from the amplifier circuit according to Embodiment 1 only in the configuration of the bias circuit 2. Accordingly, in the following section, the amplifier circuit according to the present embodiment is described with the emphasis on the configuration of the bias circuit 2.

The bias circuit 2 includes the bias output terminal 100, the bias transistor 22, the transistors 31 and 33, the resistors 41 and 42, an operational amplifier 70, and the current source 60.

The bias transistor 22 is an n-type bipolar transistor having the base terminal B1 (first control terminal), the collector terminal C1 (first terminal), and the emitter terminal E2 (second terminal).

The transistor 33 is an example of the first transistor and is a p-type field-effect-type transistor having the gate terminal G2 (second control terminal), the source terminal S3 (third terminal), and the drain terminal D4 (fourth terminal). The transistor 31 is an example of the second transistor and is a p-type field-effect-type transistor having the gate terminal G3 (third control terminal), the source terminal S5 (fifth terminal), and the drain terminal D6 (sixth terminal).

The current source 60 is connected between the drain terminal D4 and the ground. Note that the current source 60 may alternatively be connected between the source terminal S3 and the power source (power source voltage V0).

The operational amplifier 70 has a first differential input terminal, a second differential input terminal, and an output terminal. The operational amplifier 70 outputs from the output terminal an output voltage that corresponds to the difference voltage between a first voltage input to the first differential input terminal and a second voltage input to the second differential input terminal.

The first differential input terminal is connected to the drain terminal D6, the second differential input terminal is connected to the drain terminal D4, and the output terminal is connected to the connecting node between the resistors 41 and 42.

The resistor 42 is an example of the first resistor, and one end portion of the resistor 42 is connected to the base terminal B1, and the other end portion of the resistor 42 is connected to the output terminal of the operational amplifier 70. That is to say, the other end portion of the resistor 42 is connected to the drain terminal D6 via the operational amplifier 70. The resistor 41 is an example of the second resistor, and one end portion of the resistor 41 is connected to the other end portion of the resistor 42, and the other end portion of the resistor 41 is connected to the bias output terminal 100. The emitter terminal E2 is connected to the ground. With the foregoing configuration, the amplifying transistor 10 and the bias transistor 22 form the first current mirror circuit.

The base terminal B1 is connected to the drain terminal D6.

The source terminals S3 and S5 are connected to the power source (power source voltage V0). Further, the gate terminal G2 is connected to the gate terminal G3. The gate terminal G2 and the drain terminal D4 are connected to each other. With the foregoing configuration, the transistor 31 and the transistor 33 form the second current mirror circuit.

In the bias circuit 2 according to the present embodiment, the bias transistor 22, the resistors 41 and 42, and the transistors 31 and 33 are basic circuit elements for supplying the bias signal (bias current) to the amplifier 5.

In contrast, the operational amplifier 70 forms a feedback circuit for providing a stable supply of the bias signal (bias current). Specifically, the foregoing feedback circuit controls the electric potential of the collector terminal C1 based on the electric potential of the base terminal B1 of the bias transistor 22. This stabilizes the electric potential of the drain terminal D6 of the transistor 31. By stabilizing the electric potential of the drain terminal D6, it is possible to provide a stable supply of the bias signal (bias current) to the base terminal of the amplifying transistor 10.

In the following section, the working of the foregoing feedback circuit is described in detail while referring to the comparative example.

Figure 5:
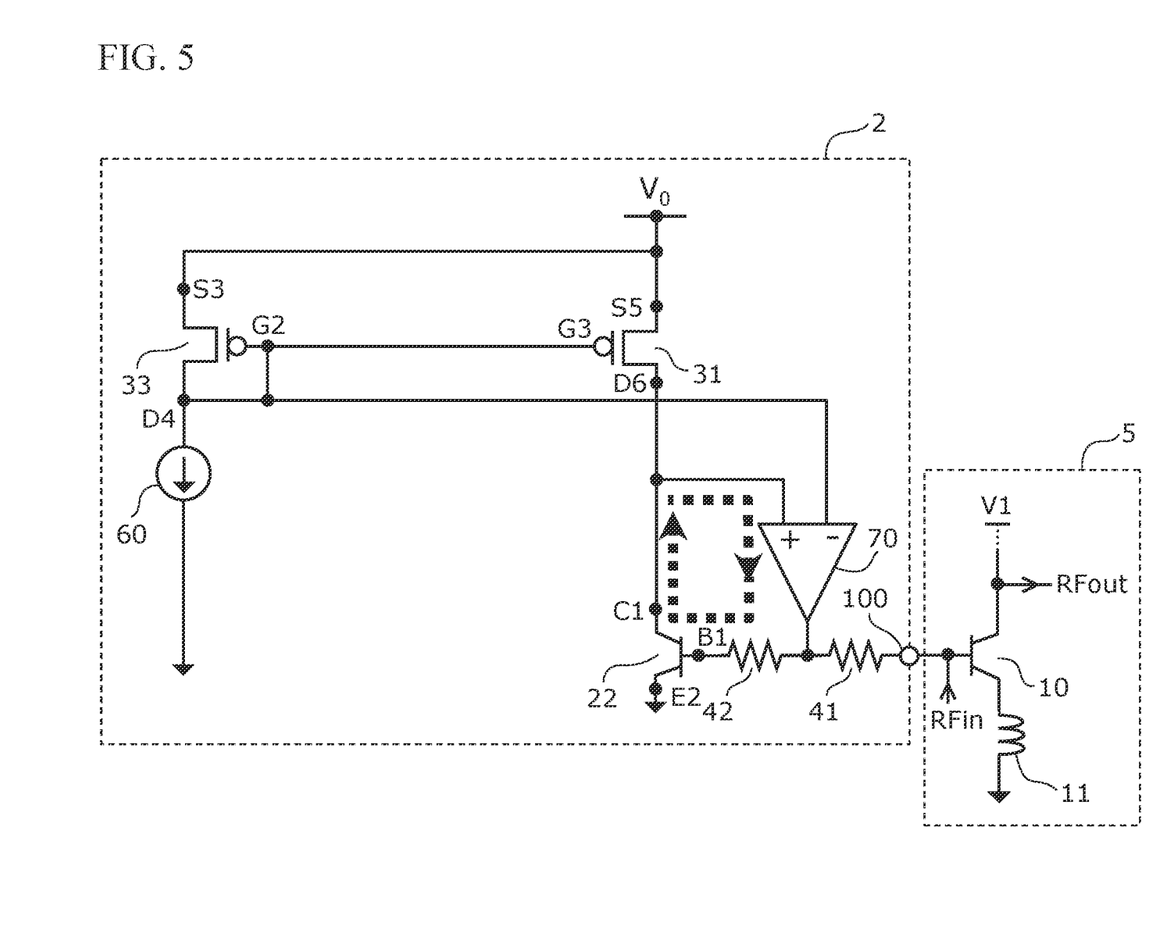
FIG. 5 is a diagram illustrating a feedback loop in a bias circuit according to Embodiment 2.

FIG. 5 is a diagram illustrating a feedback loop in the bias circuit 2 according to Embodiment 2. As already illustrated in FIG. 3, in the bias circuit 500 according to the comparative example, the electric potential Vd of the drain terminal of the transistor 31 is the electric potential of the connecting node between the resistors 41 and 42 and rises as the bias current supplied to the base terminal of the amplifying transistor 10 increases. Further, for example, in the case where the amplifier is a low-noise amplifier, the values of the resistors 41 and 42 need to be increased in order to suppress degradation of noise figure caused by the bias circuit 500. However, in particular, in the case where a bipolar transistor is used as the amplifying transistor 10, when the resistance value of the resistor 42 is increased, a voltage drop caused by the base current increases. That is to say, because the electric potential Vd of the drain terminal of the transistor 31 is determined by the product of the foregoing bias current and the resistor 41, the electric potential Vd of the drain terminal of the transistor 31 rises.

Further, in the case where the power source voltage V0 is low, as the electric potential Vd of the drain terminal of the transistor 31 rises, the source-drain voltage of the transistor 31 decreases. This destabilizes the drain current of the transistor 31 and makes it difficult to supply a stable bias current to the amplifying transistor 10.

In contrast, in the bias circuit 2 according to the present embodiment, as illustrated in FIG. 5, the feedback circuit is added to the bias circuit 500 according to the comparative example.

The foregoing feedback circuit is made up of the operational amplifier 70. The first differential input terminal is connected to the drain terminal D6, the second differential input terminal is connected to the drain terminal D4, and the output terminal is connected to the connecting node between the resistors 41 and 42. In the following section, the working of the foregoing feedback circuit is illustrated by an example.

For example, when the electric potential of the base terminal B1 falls, the drawn current to the bias transistor 22 decreases, and the electric potential of the collector terminal C1 rises. When the electric potential of the collector terminal C1 rises, the differential voltage input to the operational amplifier 70 increases, and the output voltage of the operational amplifier 70 increases. When the output voltage of the operational amplifier 70 increases, the electric potential of the connecting node between the resistors 41 and 42 rises, and the electric potential of the base terminal B1 rises. When the electric potential of the base terminal B1 rises, the drawn current to the bias transistor 22 increases, and the electric potential of the collector terminal C1 falls. That is to say, when the electric potential of the collector terminal C1 becomes higher, the electric potential of the collector terminal C1 is made lower by causing the electric potential of the base terminal B1 to rise. On the other hand, when the electric potential of the collector terminal C1 becomes lower, the electric potential of the collector terminal C1 is made higher by causing the electric potential of the base terminal B1 to fall. This causes the feedback circuit to operate in such a way that the output voltage of the operational amplifier 70 converges to 0. Note that the electric potential of the drain terminal D4 is input as a reference electric potential to the second differential input terminal of the operational amplifier 70, and thus the electric potential of the collector terminal C1 (drain terminal D6) converges to the electric potential of the drain terminal D4.

In other words, by controlling the electric potential of the collector terminal C1, the foregoing feedback circuit enables the drain current flowing through the transistor 33 and the drain current flowing through the transistor 31 to be equal to the current flowing through the current source 60 and an electric potential to be generated at the base terminal B1 and used as the bias electric potential of the transistor 10.

That is to say, the bias circuit 2 according to the present embodiment has the configuration in which the operational amplifier 70 is added to the bias circuit 500 according to the comparative example. Because of the operation of the operational amplifier 70, the source-drain voltage of the transistor 31 is always equal to the source-drain voltage of the transistor 33, and thus the current ratio of the transistor 33 and the transistor 31 is appropriately maintained even when the power source voltage, the temperature, the fabrication process, or the like varies. The electric potential of the base terminal B1 of the bias transistor 22 is controlled by the foregoing feedback circuit in such a way that the same current as the drain current of the transistor 31 flows through the bias transistor 22. As a result, the variation in the bias current to the amplifying transistor 10 is suppressed.

Effects and the Like

The amplifier circuit according to Embodiment 1 or 2 includes the amplifier 5 including the amplifying transistor 10, and the bias circuit 1 or 2 that supplies the bias signal to the amplifier 5, wherein the bias circuit 1 or 2 includes the bias output terminal 100 connected to the amplifier 5, the bias transistor 22 having the base terminal B1, the collector terminal C1, and the emitter terminal E2, the transistor 33 having the gate terminal G2, the source terminal S3, and the drain terminal D4, the transistor 31 having the gate terminal G3, the source terminal S5, and the drain terminal D6, the resistors 41 and 42, and the current source 60 connected to the drain terminal D4, the amplifying transistor 10 and the bias transistor 22 form the first current mirror circuit, the transistor 31 and the transistor 33 form the second current mirror circuit, the source terminals S3 and S5 are connected to the power source, one end portion of the resistor 42 is connected to the base terminal B1, the other end portion of the resistor 42 is connected to the drain terminal D6, one end portion of the resistor 41 is connected to the other end portion of the resistor 42, the other end portion of the resistor 41 is connected to the bias output terminal 100, and the bias circuit 1 or 2 further includes the feedback circuit that controls the electric potential of the base terminal B1 based on the electric potential of the collector terminal C1.

According to this, the electric potential of the drain terminal D6 of the transistor 31 is stabilized. The drain terminal D6 is connected to the base terminal of the amplifying transistor 10 via the resistor 41. Thus, by stabilizing the electric potential of the drain terminal D6, it is possible to provide a stable supply of the bias signal (bias current) to the base terminal of the amplifying transistor 10.

Further, in the amplifier circuit according to Embodiment 1, the feedback circuit may include the transistor 32 having the gate terminal G4, the source terminal S7, and the drain terminal D8, the transistor 34 having the gate terminal G5, the source terminal S9, and the drain terminal D10, the transistor 36 having the gate terminal G6, the drain terminal D11, and the source terminal S12, and the transistor 35 having the gate terminal G7, the drain terminal D13, and the source terminal S14, the gate terminal G4 may be connected to the gate terminal G2, the source terminals S7 and S9 may be connected to the power source, the drain terminal D8 may be connected to the base terminal B1 and the gate terminal G5, the transistor 35 and the transistor 36 may form a third current mirror circuit, the drain terminal D11 may be connected to the drain terminal D10, and the drain terminal D13 may be connected to a connecting node between the resistors 42 and 41.

According to this, the source-drain voltage of the transistor 32 is always equal to the gate-source voltage of the transistor 34, and thus, the current ratio of the transistor 33 and the transistor 32 is appropriately maintained even when the power source voltage, the temperature, the fabrication process, or the like varies. The electric potential of the base terminal B1 of the bias transistor 22 is controlled by the feedback circuit in such a way that the same current as the drain current of the transistor 32 flows through the bias transistor 22. As a result, the variation in the bias current to the amplifying transistor 10 is suppressed.

Further, in the amplifier circuit according to Embodiment 1, in the case where a bipolar-type transistor is defined as a transistor of a first kind and a field-effect-type transistor is defined as a transistor of a second kind, the amplifying transistor 10 and the bias transistor 22 may be transistors of a first conductivity type and of the same kind, the transistors 31, 32, and 33 may be transistors of a second conductivity type and of the same kind, the second conductivity type being different from the first conductivity type, the transistor 34 may be a transistor of the second conductivity type, and the transistors 35 and 36 may be transistors of the first conductivity type and of the same kind.

Even in this case, the feedback circuit enables variation in the bias current to the amplifying transistor 10 to be suppressed.

Further, in the amplifier circuit according to Embodiment 1, the amplifying transistor 10 may be a bipolar-type transistor.

The electric potential Vd of the drain terminal of the transistor 31 rises as the bias current supplied to the base terminal of the amplifying transistor 10 increases. In the case where a bipolar transistor is used as the amplifying transistor 10, a voltage drop caused by the base current increases when the resistance value of the resistor 42 is increased, and the electric potential of the drain terminal D6 rises. In a range where the electric potential of the drain terminal D6 is high, a drain current Id of the transistor 31 varies greatly. Even in this case, the feedback circuit enables the variation in the bias current to the amplifying transistor 10 to be suppressed.

Further, in the amplifier circuit according to Embodiment 1, the feedback circuit may further include the capacitor 52 connected between the drain terminal D6 and the drain terminal D8.

This enables the speed of transmitting the electric potential of the drain terminal D6 to the drain terminal D8 to be increased, and thus the feedback circuit enables an oscillation state to be suppressed and the electric potential of the drain terminal D6 to be promptly changed back to a stable state.

Further, in the amplifier circuit according to Embodiment 1, the capacitor 51 connected between the base terminal B1 and the connecting node between the resistors 41 and 42 may be included.

This enables a signal of the feedback circuit to be promptly transmitted to the base terminal B1 of the bias transistor 22 via the capacitor 51. Accordingly, it is possible to suppress the flow of the inrush current into the amplifying transistor 10.

Further, in the amplifier circuit according to Embodiment 1, the feedback circuit may further include the transistor 21 having the base terminal, the collector terminal, and the emitter terminal, the foregoing base terminal may be connected to the base terminal B1, and the foregoing collector terminal may be connected to the drain terminal D6.

This enables the drain terminal D6 to be in a low-impedance state, and thus it is possible to suppress the variation in electric potential of the drain terminal D6 at start-up and suppress a supply of overcurrent to the amplifying transistor 10.

Further, in the amplifier circuit according to Embodiment 2, the feedback circuit may include the operational amplifier 70 having the first differential input terminal, the second differential input terminal, and the output terminal, the base terminal B1 may be connected to the drain terminal D6, the first differential input terminal may be connected to the drain terminal D6, the second differential input terminal may be connected to the drain terminal D4, and the foregoing output terminal may be connected to the connecting node between the resistors 42 and 41.

According to this, the electric potential of the drain terminal D6 of the transistor 31 is stabilized. By stabilizing the electric potential of the drain terminal D6, it is possible to provide a stable supply of the bias current to the base terminal of the amplifying transistor 10.

Further, in the amplifier circuit according to Embodiment 2, the amplifying transistor 10 may be a bipolar-type transistor.

Even in this case, the feedback circuit enables the variation in the bias current to the amplifying transistor 10 to be suppressed.

Other Embodiments and the Like

The amplifier circuits according to the present disclosure have been described above using Embodiments 1 and 2. However, the amplifier circuit of the present disclosure is not limited to the foregoing embodiments. Other embodiments realized by combining optional constituent elements of the foregoing embodiments, modified examples obtained by applying various modifications conceivable by those skilled in the art to the foregoing embodiments without necessarily departing from the scope of the present disclosure, and various devices including the amplifier circuit according to the present disclosure may also be included in the present disclosure.

Note that in the amplifier circuits according to the foregoing embodiments and the modified examples thereof, another circuit element, a wiring line, or the like may be inserted in a path connecting each circuit element and a signal path disclosed in the drawings.

INDUSTRIAL APPLICABILITY

The present disclosure can be widely used as an amplifier circuit including a bias circuit that supplies a stable bias signal.

REFERENCE SIGNS LIST

1, 2, 500 Bias circuit
5 Amplifier
10 Amplifying transistor
11 Inductor
21, 31, 32, 33, 34, 35, 36 Transistor
22 Bias transistor
41, 42 Resistor
51, 52 Capacitor
60 Current source
70 Operational amplifier
100 Bias output terminal
B1 Base terminal
C1 Collector terminal
E2 Emitter terminal
D4, D6, D8, D10, D11, D13 Drain terminal
G2, G3, G4, G5, G6, G7 Gate terminal
S3, S5, S7, S9, S12, S14 Source terminal

The invention claimed is:

1. An amplifier circuit comprising:
an amplifier comprising an amplifying transistor; and
a bias circuit configured to supply a bias signal to the amplifier,
wherein the bias circuit comprises:
   a bias output terminal connected to the amplifier,
   a bias transistor having a first control terminal, a first terminal, and a second terminal,
   a first transistor having a second control terminal, a third terminal, and a fourth terminal,
   a second transistor having a third control terminal, a fifth terminal, and a sixth terminal,
   a first resistor and a second resistor, and
   a current source connected to the third terminal or the fourth terminal,
wherein the amplifying transistor and the bias transistor form a first current mirror circuit, wherein the first transistor and the second transistor form a second current mirror circuit, wherein the third terminal and the fifth terminal are connected to a power source, wherein a first end of the first resistor is connected to the first control terminal, a second end of the first resistor is connected to the sixth terminal, a first end of the second resistor is connected to the second end of the first resistor, and a second end of the second resistor is connected to the bias output terminal, wherein the bias circuit further comprises a feedback circuit configured to control an electric potential of the first control terminal based on an electric potential of the first terminal, wherein the feedback circuit comprises:
a third transistor having a fourth control terminal, a seventh terminal, and an eighth terminal,
a fourth transistor having a fifth control terminal, a ninth terminal, and a tenth terminal,
a fifth transistor having a sixth control terminal, an eleventh terminal, and a twelfth terminal, and
a sixth transistor having a seventh control terminal, a thirteenth terminal, and a fourteenth terminal, wherein the fourth control terminal is connected to the second control terminal, the seventh terminal and the ninth terminal are connected to the power source, and the eight terminal is connected to the first terminal and the fifth control terminal, wherein the fifth transistor and the sixth transistor form a third current mirror circuit, and wherein the eleventh terminal is connected to the tenth terminal, and the thirteenth terminal is connected to a node between the first resistor and the second resistor.

2. The amplifier circuit according to claim 1,
wherein the amplifying transistor and the bias transistor are transistors of a first conductivity type, and are each bipolar-type transistors or are each field-effect-type transistors,
wherein the first transistor, the second transistor, and the third transistor are of a second conductivity type, and are each bipolar-type transistors or are each field-effect-type transistors, the second conductivity type being different from the first conductivity type,
wherein the fourth transistor is a transistor of the second conductivity type, and
wherein the fifth transistor and the sixth transistor are transistors of the first conductivity type, and are each bipolar-type transistors or are each field-effect-type transistors.

3. The amplifier circuit according to claim 2, wherein the amplifying transistor is a bipolar-type transistor.

4. The amplifier circuit according to claim 1, wherein the feedback circuit further comprises a first capacitor connected between the sixth terminal and the eighth terminal.

5. The amplifier circuit according to claim 1, wherein the feedback circuit further comprises a second capacitor connected between the first control terminal and the node.

6. The amplifier circuit according to claim 1,
wherein the feedback circuit further comprises a seventh transistor having an eighth control terminal, a fifteenth terminal, and a sixteenth terminal, and
wherein the eighth control terminal is connected to the first control terminal, and the fifteenth terminal is connected to the sixth terminal.

7. An amplifier circuit comprising:
an amplifier comprising an amplifying transistor; and
a bias circuit configured to supply a bias signal to the amplifier,
wherein the bias circuit comprises:
a bias output terminal connected to the amplifier,
a bias transistor having a first control terminal, a first terminal, and a second terminal,
a first transistor having a second control terminal, a third terminal, and a fourth terminal,
a second transistor having a third control terminal, a fifth terminal, and a sixth terminal,
a first resistor and a second resistor, and
a current source connected to the third terminal or the fourth terminal, wherein the amplifying transistor and the bias transistor form a first current mirror circuit, wherein the first transistor and the second transistor form a second current mirror circuit, wherein the third terminal and the fifth terminal are connected to a power source, wherein a first end of the first resistor is connected to the first control terminal, a second end of the first resistor is connected to the sixth terminal, a first end of the second resistor is connected to the second end of the first resistor, and a second end of the second resistor is connected to the bias output terminal, wherein the bias circuit further comprises a feedback circuit configured to control an electric potential of the first control terminal based on an electric potential of the first terminal, and wherein the feedback circuit comprises an operational amplifier having a first differential input terminal, a second differential input terminal, and an output terminal, wherein the first terminal is connected to the sixth terminal, wherein the first differential input terminal is connected to the sixth terminal, wherein the second differential input terminal is connected to the fourth terminal, and wherein the output terminal is connected to a node between the first resistor and the second resistor.

8. The amplifier circuit according to claim 7, wherein the amplifying transistor is a bipolar-type transistor.

* * * * *